United States Patent
Kuehlwein (10) Patent No.: US 8,861,125 B2
(45) Date of Patent: Oct. 14, 2014

(54) PREAMPLIFIER OUTPUT CURRENT CONTROL

(71) Applicant: Texas Instruments Incorporated, Dallas, TX (US)

(72) Inventor: Jeremy R Kuehlwein, Woodbury, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/839,218

(22) Filed: Mar. 15, 2013

(65) Prior Publication Data

US 2014/0139941 A1    May 22, 2014

Related U.S. Application Data

(60) Provisional application No. 61/636,783, filed on Apr. 23, 2012.

(51) Int. Cl.
*G11B 5/02* (2006.01)
*G11B 5/09* (2006.01)
*H03K 5/08* (2006.01)
*G11B 20/10* (2006.01)

(52) U.S. Cl.
CPC ............ *H03K 5/08* (2013.01); *G11B 20/10009* (2013.01)
USPC .............................................. 360/67; 360/46

(58) Field of Classification Search
None
See application file for complete search history.

(56) References Cited

U.S. PATENT DOCUMENTS

| 7,154,693 | B2 | 12/2006 | Price | |
|---|---|---|---|---|
| 7,697,225 | B2 | 4/2010 | Takahashi | |
| 7,830,361 | B2 | 11/2010 | Muraki | |
| 2004/0263252 | A1* | 12/2004 | Dashtestani et al. | 330/267 |
| 2010/0201436 | A1* | 8/2010 | Huang | 327/538 |
| 2010/0237910 | A1* | 9/2010 | Mukhopadhyay et al. | 327/108 |

* cited by examiner

*Primary Examiner* — Regina N Holder
(74) *Attorney, Agent, or Firm* — Alan A. R. Cooper; Frederick J. Telecky, Jr.

(57) ABSTRACT

One embodiment includes a preamplifier system. The system includes a reference stage configured to set a magnitude of a clamping voltage for a reference node based on a reference current generated in an adjustable reference current path. The system also includes an output stage comprising an adjustable slew current source that is configured to provide an activation current to the reference node in response to at least one activation signal, the output stage to generate an output current at an output of the output stage with a magnitude that is based on the clamping voltage.

14 Claims, 3 Drawing Sheets

PREAMPLIFIER OUTPUT CURRENT CONTROL

CROSS-REFERENCE TO RELATED APPLICATION

This application claims the benefit of U.S. Provisional Patent Application 61/636,783 filed on Apr. 23, 2012, entitled OVERSHOOT SWITCHING SCHEME FOR HDD PREAMP WITH INDEPENDENT AMPLITUDE, RISING EDGE SLEW RATE, AND FALLING EDGE SLEW RATE, the entirety of which is incorporated by reference herein.

TECHNICAL FIELD

This disclosure relates generally to electronic circuit systems, and specifically to preamplifier output current control.

BACKGROUND

Preamplifier circuits can be implemented for a variety of purposes, such as to generate an overshoot current for writing data to a magnetic medium (e.g., a disk drive, such as a hard-disk drive). As an example, a preamplifier circuit can be configured to provide an output current pulse in response to an input current pulse, with the output current pulse having a magnitude that is amplified relative to the input current pulse by a gain factor. It can be desirable to tune such gain factor, such as based on requirements dictated by the preamplifier application. In addition, given the sensitivity of a given magnetic medium in a disk-write preamplifier application, it can likewise be desirable to tune a slew-rate associated with the output current pulse to avoid affecting data in adjacent tracks on the magnetic medium while still maintaining a rapid write speed. Such slew-rate can be tuned in typical preamplifier circuits based on the selecting different values for the gain resistor or input current pulse, which can thus also affect the gain of the output current pulse, or based on switching in additional current-pulse components to the input current pulse, which can provide timing conflicts.

SUMMARY

One embodiment includes a preamplifier system. The system includes a reference stage configured to set a magnitude of a clamping voltage for a reference node based on a reference current generated in an adjustable reference current path. The system also includes an output stage comprising an adjustable slew current source that is configured to provide an activation current to the reference node in response to at least one activation signal, the output stage to generate an output current at an output of the output stage with a magnitude that is based on the clamping voltage.

Another embodiment includes a method for generating an output current at an output of a preamplifier system. The method includes setting a magnitude of a DC reference current to set a magnitude of a clamping voltage associated with a reference node. The method also includes activating a first adjustable slew current source to provide an activation current to the reference node to generate the output current at the output of the preamplifier system. The output current can have a magnitude that is based on the magnitude of the clamping voltage. The method further includes activating a second adjustable slew current source to provide a deactivation current from the reference node to deactivate the output current.

Another embodiment includes a preamplifier system. The system includes a reference stage comprising an adjustable reference current path configured to generate a reference current. The system also includes an output stage comprising a first adjustable slew current source and a second adjustable slew current source. The first adjustable slew current source can be activated to provide an activation current to generate an output current at an output of the output stage. The second adjustable slew current source can be activated to provide a deactivation current to deactivate the output current. The output current can have a magnitude that is based on the reference current and having a rising-edge slew rate and a falling-edge slew rate that is based on a magnitude of the activation current and the deactivation current, respectively.

DETAILED DESCRIPTION

This disclosure relates generally to electronic circuit systems, and specifically to preamplifier output current control. The preamplifier system includes a reference stage and an output stage that are interconnected via a reference node. The reference stage includes an adjustable reference current source that is configured to generate a DC reference current through a reference resistor to set magnitudes of a first clamping voltage and a second clamping voltage that are associated with the reference node. The first clamping voltage can be associated with an approximate maximum magnitude of an output current that is provided at an output of the preamplifier system (e.g., from the output stage). The second clamping voltage can be associated with deactivation of the output current.

The output stage can include a first adjustable slew current source and a second adjustable slew current source. The first adjustable slew current source can be activated via a first activation signal to provide an activation current to the reference node to increase a reference voltage at the reference node. The output stage can also include an arrangement of bias transistors and an output transistor. The set of bias transistors can set an activation voltage for the output transistor based on the magnitude of the first and second clamping voltages, and the output transistor can be activated based on the reference voltage (e.g., being less than the first clamping voltage) to provide the output current. The magnitude of the first adjustable slew current source can define a rising-edge slew rate of the output current, and the magnitude of the second adjustable slew current source can define a falling-edge slew rate of the output current. Therefore, the tunable parameters of the preamplifier system with respect to the approximate maximum magnitude of the output current, the rising-edge slew rate of the output current, and the falling-edge slew rate can be separately tunable.

Figure 1:
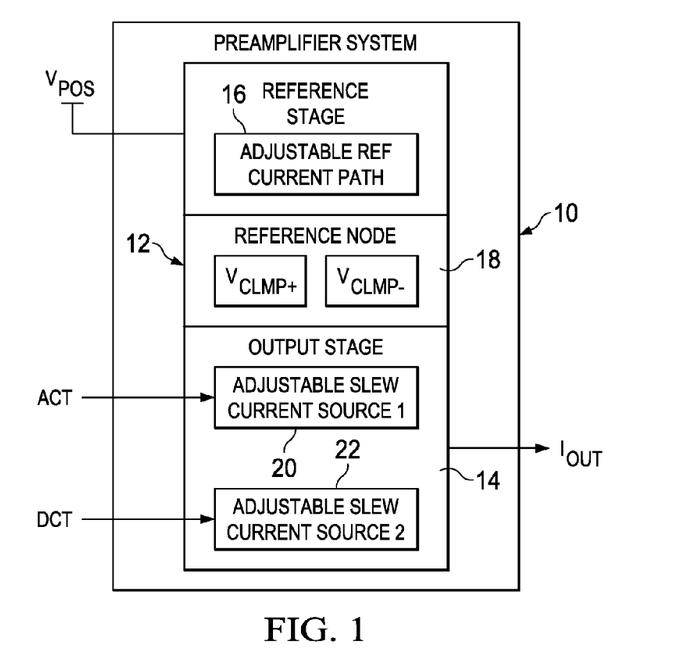
FIG. 1 illustrates an example of a preamplifier system.

FIG. 1 illustrates an example of a preamplifier system 10. The preamplifier system 10 is configured to generate an output current $I_{OUT}$ that can be provided for a variety of applications. For example, the preamplifier system can be implemented in a variety of disk-drive write applications, such as to provide an overshoot current in a hard-disk drive (HDD) write system.

The preamplifier system 10 includes a reference stage 12 and an output stage 14. The reference stage 12 includes an adjustable reference current path 16 that is configured to generate a reference current based on a voltage $V_{POS}$, which can be a high-voltage rail (e.g., +5V). As an example, the adjustable reference current path 16 can include an adjustable current source and/or a variable resistor. The reference current can be a DC current that is provided to set a first clamping voltage $V_{CLMP+}$ and a second clamping voltage $V_{CLMP-}$ that are associated with a reference node 18 that interconnects the reference stage 12 and the output stage 14. For example, the first clamping voltage $V_{CLMP+}$ can be associated with an approximate maximum magnitude of the output current $I_{OUT}$, and the second clamping voltage $V_{CLMP-}$ can be associated with deactivation of the output current $I_{OUT}$. For example, the first and second clamping voltages $V_{CLMP+}$ and $V_{CLMP-}$ can define a respective magnitude limits of a reference voltage on which the output current TOUT is based. As an example, the reference stage 12 can include a reference resistor through which the reference current flows to provide a voltage that is level-shifted to the reference node 18, such that an arrangement of transistors can set the magnitudes of the first and second clamping voltages $V_{CLMP+}$ and $V_{CLMP-}$.

The output stage 14 includes a first adjustable slew current source 20 and a second adjustable slew current source 22. The first adjustable slew current source 20 is configured to provide an activation current to the reference node 18 in response to an activation signal ACT to increase a reference voltage at the reference node 18. The second adjustable slew current source 22 is configured to provide a deactivation current from the reference node 18 in response to a deactivation signal DCT to decrease the reference voltage at the reference node 18. The activation and deactivation signals ACT and DCT can be, for example, digital signals that can independently activate and deactivate the respective first and second adjustable slew current sources 20 and 22. As an example, the output stage 14 can also include an arrangement of bias transistors and an output transistor. The arrangement of bias transistors can set an activation voltage for the output transistor based on the magnitudes of the first and second clamping voltages $V_{CLMP+}$ and $V_{CLMP-}$. As an example, the activation voltage can have a magnitude that is less than the magnitude of first clamping voltage $V_{CLMP+}$ by a predetermined amount. As a result, the output transistor can be activated based on the magnitude of the reference voltage at the reference node 18 to provide the output current $I_{OUT}$.

As an example, in response to assertion of the activation signal ACT, the first adjustable slew current source 20 can be activated to increase the reference voltage at the reference node 18. Upon the reference voltage increasing to greater than the activation voltage, the output transistor can be activated to begin providing the output current $I_{OUT}$, which can increase at a rising-edge slew rate as the reference voltage increases above the activation voltage. The reference voltage can achieve an approximate maximum magnitude when approximately equal to the first clamping voltage $V_{CLMP+}$, which can result in the output current $I_{OUT}$ likewise achieving an approximate maximum magnitude. The activation signal ACT can subsequently be de-asserted, and the deactivation signal DCT can be asserted to deactivate the output current $I_{OUT}$. In response to assertion of the deactivation signal DCT, the second adjustable slew current source 22 can be activated to decrease the reference voltage at the reference node 18. The output current can decrease at a falling-edge slew rate as the reference voltage decreases. Upon the reference voltage decreasing to less than the activation voltage, the output transistor can be deactivated to deactivate the output current $I_{OUT}$. Upon the reference voltage being approximately equal to the second clamping voltage $V_{CLMP-}$, the reference voltage can thus achieve an approximate minimum magnitude, which can maintain deactivation of the output current $I_{OUT}$.

As described previously, the magnitude of the reference current generated by the adjustable reference current path 16 sets the magnitude of the first clamping voltage $V_{CLMP+}$, which is associated with the magnitude of output current $I_{OUT}$. Therefore, the adjustable reference current path 16 can be adjusted to set a magnitude of the first clamping voltage $V_{CLMP+}$, which can thus set the magnitude of the output current $I_{OUT}$ based on the application of the preamplifier system 10. In addition, as described previously, the first adjustable slew current source 20 and the second adjustable slew current source 22 can be separately and independently adjustable to set the rising-edge slew rate and the falling-edge slew rate of the output current $I_{OUT}$. Therefore, the waveform characteristics of the output current $I_{OUT}$ can be set separately and independently with respect to each other, such that adjusting one such parameter has no effect on the others, unlike typical preamplifier systems that implement adjustments to an input current pulse and/or timing adjustments to change the parameters of the output current. In addition, as described in greater detail herein, the preamplifier system 10 can substantially mitigate power consumption relative to typical preamplifier systems.

Figure 2:
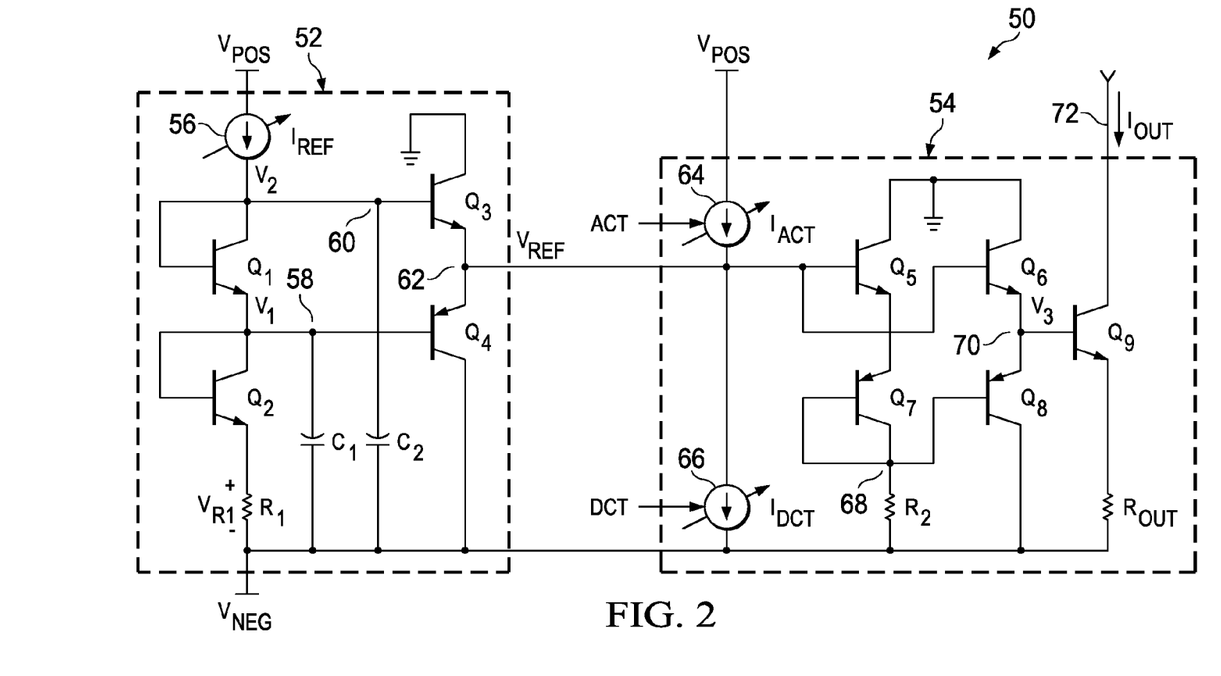
FIG. 2 illustrates an example of a preamplifier circuit.

FIG. 2 illustrates an example of a preamplifier circuit 50. The preamplifier circuit 50 is configured to generate an output current $I_{OUT}$ that can be provided for a variety of applications, such as to provide an overshoot current in a hard-disk drive (HDD) write system. As an example, the preamplifier circuit 50 can be configured as or as part of an integrated circuit (IC).

The preamplifier circuit 50 includes a reference stage 52 and an output stage 54. The reference stage 52 includes an adjustable reference current source 56 that is configured to generate a DC reference current $I_{REF}$ from a high-voltage rail $V_{POS}$ (e.g., +5V). The adjustable reference current source 56 can be adjusted to provide an adjustable magnitude of the reference current $I_{REF}$. The reference current $I_{REF}$ is provided through a first diode-connected NPN bipolar junction transistor (BJT) $Q_1$, a second diode-connected NPN BJT $Q_2$, and a reference resistor $R_1$ to a low voltage rail $V_{NEG}$ (e.g., −3V). As a result, a voltage $V_{R1}$ is provided across the reference resistor $R_1$, where the voltage $V_{R1}$ has a magnitude that is based on a magnitude of the reference current $I_{REF}$ (i.e., $V_{R1}=I_{REF}*R_1$). It is to be understood that the magnitudes of the voltages described herein are referenced with respect to the low-voltage rail $V_{NEG}$. While the example of FIG. 2 demonstrates that the current path of the reference current IREF includes the current source 56 that can be adjusted to control the magnitude of the reference current $I_{REF}$, it is to be understood that other ways for controlling the magnitude of the reference current $I_{REF}$ can be implemented, such as providing the reference resistor $R_1$ as a variable resistor.

The BJTs $Q_1$ and $Q_2$ thus each provide level-shifting of the voltage $V_{R1}$ by a factor of a base-emitter voltage ($V_{BE}$) of the BJTs $Q_1$ and $Q_2$ to a first node 58 that interconnects the BJTs $Q_1$ and $Q_2$ and to a second node 60 that interconnects the BJT $Q_1$ and the adjustable reference current source 56. In the example of FIG. 2, the first node 58 has a voltage $V_1$ that can be approximately equal to $V_{R1}+V_{BE}$ and the second node 60 has a voltage $V_2$ that can be approximately equal to $V_{R1}+2*V_{BE}$. As an example, the transistors of the preamplifier circuit 50 can all be fabricated as substantially process-matched components, such that the $V_{BE}$ of each of the transistors, including BJTs $Q_1$ and $Q_2$, can all be approximately equal. The reference stage 52 also includes a first capacitor $C_1$ interconnecting the first node 58 and the low voltage rail $V_{NEG}$ and a second capacitor $C_2$ interconnecting the second node 60 and the low voltage rail $V_{NEG}$. Therefore, the voltages $V_1$ and $V_2$ can remain substantially constant for a given DC reference current $I_{REF}$.

The reference stage 52 further includes an NPN BJT $Q_3$ and a PNP BJT $Q_4$ that are interconnected at the emitters by a reference node 62. The BJT $Q_3$ has a base that is coupled to the second node 60 and a collector that is coupled to a different low-voltage rail, demonstrated in the example of FIG. 2 as ground. Ground, for example, can correspond to a voltage that resides between $V_{POS}$ and $V_{NEG}$. The BJT $Q_4$ has a base that is coupled to the first node 58 and a collector that is coupled to the low-voltage rail $V_{NEG}$. Therefore, based on the respective base-emitter voltage $V_{BE}$ of each of the respective BJTs $Q_3$ and $Q_4$, the voltages $V_1$ and $V_2$ can define a first clamping voltage $V_{CLMP+}$ and a second clamping voltage $V_{CLMP-}$ associated with the reference node 62. The first clamping voltage $V_{CLMP+}$ can define a magnitude of the reference voltage $V_{REF}$ at the reference node 62 at which the BJT $Q_4$ activates (e.g., $V_{CLMP+}=V_{R1}+2*V_{BE}$). Similarly, the second clamping voltage $V_{CLMP-}$ thus defines a magnitude of the reference voltage $V_{REF}$ at which the BJT $Q_3$ activates (e.g., $V_{CLMP-}=V_{R1}+V_{BE}$). Accordingly, the first and second clamping voltages $V_{CLMP+}$ and $V_{CLMP-}$ define approximate maximum and minimum magnitudes, respectively, of the reference voltage $V_{REF}$.

The output stage 54 includes a first adjustable slew current source 64 and a second adjustable slew current source 66. The first adjustable slew current source 64 interconnects the high-voltage rail $V_{POS}$ and the reference node 62 and is configured to provide an activation current $I_{ACT}$ to the reference node 62 in response to an activation signal ACT. The first adjustable slew current source 64 can be adjusted to provide an adjustable magnitude of the activation current $I_{ACT}$. In response to the activation signal ACT, the activation current $I_{ACT}$ is provided to the reference node 62 which increases the magnitude of the reference voltage $V_{REF}$, such as based on the charging of parasitic capacitance associated with the components of the preamplifier circuit 50 (e.g., the transistors and the metal traces). Similarly, the second adjustable slew current source 66 interconnects the low-voltage rail $V_{NEG}$ and the reference node 62 and is configured to pull a deactivation current $I_{DCT}$ from the reference node 62 in response to a deactivation signal DCT. The second adjustable slew current source 66 can be adjusted to provide an adjustable magnitude of the deactivation current $I_{DCT}$. In response to the deactivation signal DCT, the deactivation current $I_{DCT}$ is pulled from the reference node 62 which decreases the magnitude of the reference voltage $V_{REF}$. As is described in greater detail herein, the second adjustable slew current source 66 can also be configured to conduct a minimal current from the reference node 62 to maintain deactivation of the output current $I_{OUT}$, such as during a rest state of the preamplifier circuit 50. As explained in greater detail herein, the activation and deactivation signals ACT and DCT can be provided to selectively initiate and deactivate the output current $I_{OUT}$.

The output stage 54 also includes NPN BJTs $Q_5$ and $Q_6$, PNP BJTs $Q_7$ and $Q_8$, a resistor $R_2$, an NPN BJT $Q_9$ that is configured as an output transistor, and an output resistor $R_{OUT}$. The BJTs $Q_5$ and $Q_7$ are emitter-coupled, with the BJT $Q_5$ having a base coupled to the reference node 62 and a collector coupled to ground. The BJT $Q_7$ is diode-connected, with a base/collector coupled to a node 68, while the resistor $R_2$ interconnects the node 68 and the low-voltage rail $V_{NEG}$. The BJT $Q_6$ has a base coupled to the reference node 62, a collector coupled to ground, and an emitter coupled to an activation node 70 having a voltage $V_3$, while the BJT $Q_8$ has a base coupled to the node 68, a collector coupled to the low-voltage rail $V_{NEG}$, and an emitter coupled to the activation node 70. The BJT $Q_9$ has a base that is coupled to the activation node 70, a collector that is coupled to an output 72 of the preamplifier circuit 50, and an emitter that is coupled to the output resistor $R_{OUT}$ that interconnects the BJT $Q_9$ and the low-voltage rail $V_{NEG}$. As an example, the resistors $R_2$ and $R_{OUT}$ can have resistance magnitudes that are approximately equal, and can be less than the resistance magnitude of the resistor $R_1$ by a fixed proportional gain factor "X".

The BJTs $Q_5$ through $Q_8$ can thus be arranged as bias transistors to provide level-shifting to set an activation voltage of the BJT $Q_9$. In the example of FIG. 2, because the bases of the BJTs $Q_7$ and $Q_8$ are coupled to the resistor $R_2$ and because the emitters of the BJTs $Q_5$ and $Q_7$ and the BJTs $Q_6$ and $Q_8$ are coupled together, the BJTs $Q_5$ and $Q_6$ can have an activation voltage that is set at approximately $2*V_{BE}$. Therefore, upon the reference voltage $V_{REF}$ increasing to approximately the magnitude of $2*V_{BE}$ in response to the activation current $I_{ACT}$ being provided by the first adjustable slew current source 64 to the reference node 62, the BJTs $Q_5$ and $Q_6$ activate. Upon the BJT $Q_6$ activating, the output transistor $Q_9$ activates to begin conducting the output current $I_{OUT}$ through the output resistor $R_{OUT}$. As an example, the output current $I_{OUT}$ can be conducted from a load, such as a transducer in a disk-drive write system.

Subsequent to the output transistor $Q_9$ activating, the reference voltage $V_{REF}$ continues to increase (e.g., linearly) based on the activation current $I_{ACT}$ that continues to be provided from the first adjustable slew current source 64. For example, the reference voltage $V_{REF}$ increases from the magnitude at which the output transistor $Q_9$ activates (e.g., approximately $2*V_{BE}$) to the approximate maximum magnitude defined by the first clamping voltage $V_{CLMP+}$ (e.g., $V_{CLMP+}=V_{R1}+2*V_{BE}$). As the reference voltage $V_{REF}$ increases approximately linearly between the activation voltage and the first clamping voltage $V_{CLMP+}$, the output current $I_{OUT}$ also increases approximately linearly, achieving an approximate maximum magnitude upon the reference voltage $V_{REF}$ being approximately equal to the first clamping voltage $V_{CLMP+}$. For example, when the reference voltage $V_{REF}$ is approximately equal to the first clamping voltage $V_{CLMP+}$, the BJT $Q_4$ activates to begin conducting the activation current $I_{ACT}$ from the reference node 62 to the low-voltage rail $V_{NEG}$. Thus, the reference voltage $V_{REF}$ achieves an approximate maximum magnitude, which results in the output current $I_{OUT}$ likewise achieving an approximate maximum magnitude.

The rising-edge slew rate of the output current $I_{OUT}$ thus depends on the rate of increase of the reference voltage $V_{REF}$, which depends on the magnitude of the activation current $I_{ACT}$. For example, the magnitude of the activation current $I_{ACT}$ affects the rate at which the parasitic capacitance of the components of the preamplifier circuit 50 is charged, which affects the rate at which the reference voltage $V_{REF}$ increases. Accordingly, the first adjustable slew current source 64 can be controlled to affect the magnitude of the activation current $I_{ACT}$, and thus the rising-edge slew rate of the output current $I_{OUT}$.

As described previously, the approximate maximum magnitude of the output current $I_{OUT}$ is set by the magnitude of the first clamping voltage $V_{CLMP+}$, which depends on the magnitude of the reference current $I_{REF}$. In the example of FIG. 2, as described previously, the magnitude of the first clamping voltage $V_{CLMP+}$ is approximately equal to $V_{R1}+2*V_{BE}$. Upon the reference voltage $V_{REF}$ being equal to the first clamping voltage $V_{CLMP+}$, the output current $I_{OUT}$ achieves an approximate maximum magnitude. At this time, the voltage $V_3$ at the activation node 70 is approximately equal to $V_{R1}+V_{BE}$, and the voltage across the output resistor $R_{OUT}$ is approximately equal to $V_{R1}$. As described previously, the output resistor $R_{OUT}$ can have a magnitude that is less than resistor $R_1$ by the fixed proportional gain factor "X". Accordingly, based on the voltage $V_{R1}$ across the output resistor $R_{OUT}$, the output current $I_{OUT}$ can have a magnitude that is greater than the reference current $I_{REF}$ by the fixed proportional gain factor "X".

To deactivate the output current $I_{OUT}$, the activation signal ACT provided to the first adjustable slew current source 64 can be de-asserted, and the deactivation signal DCT can be provided to the second adjustable slew current source 66 to begin providing the deactivation current $I_{DCT}$ from the reference node 62. In response, the reference voltage $V_{REF}$ begins to approximately linearly decrease based on a discharge of the parasitic capacitance of the components of the preamplifier circuit 50, thus causing the BJT $Q_4$ to deactivate and causing the output current $I_{OUT}$ to likewise decrease approximately linearly. The output current $I_{OUT}$ continues to decrease approximately linearly, achieving an approximate minimum magnitude upon the reference voltage $V_{REF}$ being approximately equal to the activation voltage (e.g., approximately $2*V_{BE}$). Upon the reference voltage $V_{REF}$ decreasing less than the activation voltage (e.g., approximately $2*V_{BE}$), the output transistor $Q_9$ is deactivated to cease the flow of the output current $I_{OUT}$ through the output resistor $R_{OUT}$. The reference voltage $V_{REF}$ continues to decrease in magnitude based on the flow of the deactivation current $I_{DCT}$. When the reference voltage $V_{REF}$ is approximately equal to the second clamping voltage $V_{CLMP-}$, the BJT $Q_3$ activates to begin conducting the deactivation current $I_{DCT}$ to the reference node 62 from ground.

The falling-edge slew rate of the output current $I_{OUT}$ thus depends on the rate of decrease of the reference voltage $V_{REF}$, which further depends on the magnitude of the deactivation current $I_{DCT}$. For example, the magnitude of the deactivation current $I_{DCT}$ affects the rate at which the parasitic capacitance of the components of the preamplifier circuit 50 is discharged, which affects the rate at which the reference voltage $V_{REF}$ decreases. Accordingly, the second adjustable slew current source 66 can be adjustable to affect the magnitude of the deactivation current $I_{DCT}$, and thus the falling-edge slew rate of the output current $I_{OUT}$. Furthermore, upon de-assertion of the deactivation signal DCT, the second adjustable slew current source 66 can be configured to conduct a minimal amount of current from the reference node 62, such as during a rest state of the preamplifier circuit 50 (e.g., de-assertion of both the activation signal ACT and the deactivation signal DCT) to maintain the reference voltage $V_{REF}$ approximately equal to the second clamping $V_{CLMP-}$, thus maintaining the deactivation of the output current $I_{OUT}$.

The preamplifier circuit 50 is thus an example of a preamplifier system for generating the output current $I_{OUT}$ in a manner in which the characteristics of the output current $I_{OUT}$ can all be set separately and independently with respect to each other, based on the adjustable reference current source, the first adjustable slew current source 64, and the second adjustable slew current source 66, without requiring additional timing of signals to affect the respective slew rates, as is the case in some typical preamplifier circuits. In addition, because the output current $I_{OUT}$ is generated at a magnitude that is greater than the reference current $I_{REF}$ by the fixed proportional gain factor "X", the reference current $I_{REF}$ can be provided as a substantially small current to substantially mitigate power consumption of the preamplifier circuit 50. Furthermore, the output current $I_{OUT}$ is provided from zero to approximate maximum magnitude based on the magnitude of the reference voltage $V_{REF}$, which increases and decreases between an approximate minimum magnitude of the second clamping voltage $V_{CLMP-}$ and an approximate maximum magnitude of the first clamping voltage $V_{CLMP+}$, respectively. Because the difference between the first and second clamping voltages $V_{CLMP+}$ and $V_{CLMP-}$ is only a single diode-drop (e.g., $V_{BE}$), fast and efficient activation and deactivation of the output current $I_{OUT}$ can be effected by only a voltage swing of the single diode-drop at the critical node (e.g., the reference node 62), as opposed to larger voltage slew in typical preamplifier circuits.

Figure 3:
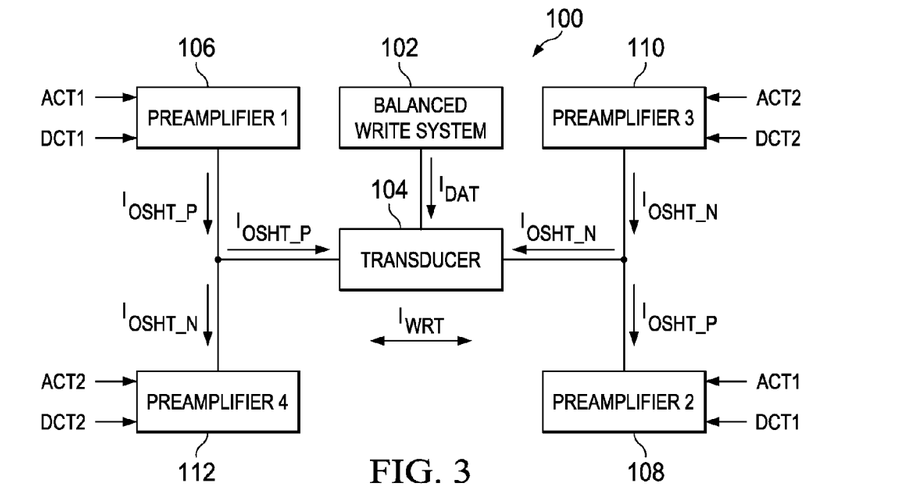
FIG. 3 illustrates an example of a disk-drive write system.

FIG. 3 illustrates an example of a disk-drive write system 100. The disk-drive write system 100 can be implemented in a variety of computer applications, such as for a hard-disk drive (HDD) or peripheral disk-drive. The disk-drive write system 100 includes a balanced write system 102 configured to generate a data current $I_{DAT}$ that is provided to a transducer 104. For example, the transducer 104 can be a magnetic load configured to generate a magnetic field in one of two states to write data to a magnetic medium (e.g., a disk-drive) based on the state of the magnetic field. As an example, the data current $I_{DAT}$ can be provided at a magnitude of 40 mA to write data in the first state, and at a magnitude of −40 mA to write data in the second state. As an example, the balanced write system 102 can be configured as an AB-driver circuit to provide a balanced common-mode voltage with respect to the transmission lines associated with the transducer 104 for writing the data with a positive or negative magnitude of the data current $I_{DAT}$.

The disk-drive write system 100 also includes a first preamplifier system 106, a second preamplifier system 108, a third preamplifier system 110, and a fourth preamplifier system 112. Each of the preamplifier systems 106, 108, 110, and 112 can be configured substantially similar to the preamplifier circuit 50 in the example of FIG. 2, with the first and third preamplifier systems 106 and 110 being inverted with respect to rails, transistors, and polarity. For example, the first and third preamplifier systems 106 and 110 can substitute the NPN and PNP BJTs with respective PNP and NPN BJTs, and can reverse the respective high-voltage rail $V_{POS}$ and the low-voltage rail $V_{NEG}$. Therefore, the preamplifier systems 106, 108, 110, and 112 can be arranged as an H-bridge with respect to the transducer 104 to provide an overshoot current $I_{OSHT}$ in one of two directions through the transducer 104. In the example of FIG. 3, the first and second preamplifier systems 106 and 108 are concurrently activated to generate an overshoot current $I_{OSHT\_P}$ that can be added to a positive magnitude of the data current $I_{DAT}$ for writing data in the first state, such that the overshoot current $I_{OSHT\_P}$ can demagnetize the transducer 104 subsequent to writing data in the second state. Similarly, the third and fourth preamplifier systems 110 and 112 are concurrently activated to generate an overshoot current $I_{OSHT\_N}$ in an opposite direction of the overshoot current $I_{OSHT\_P}$, such that the overshoot current $I_{OSHT\_N}$ can be added to a negative magnitude of the data current $I_{DAT}$ for writing data in the second state to demagnetize the transducer 104 subsequent to writing data in the first state.

For example, at a transition from a logic-0 to a logic-1 to be written to the magnetic medium via the transducer 104, the data current $I_{DAT}$ can be provided from the balanced write system 102 at a positive magnitude (e.g., approximately 40 mA). In addition, the activation signal ACT1 can be asserted in each of the first and second preamplifier systems 106 and 108. As a result, a respective first adjustable slew current source in each of the first and second preamplifier systems 106 and 108 can be activated to provide the overshoot current $I_{OSHT\_P}$, which can correspond to the respective output current $I_{OUT}$ of each of the first and second preamplifier systems 106 and 108. The overshoot current $I_{OSHT\_P}$ can be added to the data current $I_{DAT}$ to provide a write current $I_{WRT}$ in a first direction through the transducer 104. Similar to as described previously in the example of FIGS. 1 and 2, the rising-edge slew rate of the overshoot current $I_{OSHT\_P}$ can correspond to the magnitude of the activation current $I_{ACT}$ in each of the first and second preamplifier systems 106 and 108, and the approximate maximum magnitude of the overshoot current $I_{OSHT\_P}$ can correspond to the magnitude of the reference current $I_{REF}$, and thus the magnitude of the first clamping voltage $V_{CLMP+}$, in each of the first and second preamplifier systems 106 and 108. After a predetermined time for demagnetization of the transducer 104 from the logic-0 state, the activation signal ACT1 can be de-asserted and the deactivation signal DCT1 can be asserted. Thus, the overshoot current $I_{OSHT\_P}$ can be deactivated at a falling-edge slew rate that depends on the magnitude of the deactivation current $I_{DCT}$ in each of the first and second preamplifier systems 106 and 108. The deactivation signal DCT1 can be de-asserted after the overshoot current $I_{OSHT\_P}$ is deactivated, but the second adjustable slew current source can continue to provide a minimal amount of current to maintain deactivation of the overshoot current $I_{OSHT\_P}$. The data current $I_{DAT}$ can thus continue to be provided at the positive magnitude to continue to write logic-1 data to the magnetic medium.

At a transition from a logic-1 to a logic-0 to be written to the magnetic medium via the transducer 104, the data current $I_{DAT}$ can be provided from the balanced write system 102 at a negative magnitude (e.g., approximately −40 mA). In addition, the activation signal ACT2 can be asserted in each of the third and fourth preamplifier systems 110 and 112. As a result, a respective first adjustable slew current source in each of the third and fourth preamplifier systems 110 and 112 can be activated to provide the overshoot current $I_{OSHT\_N}$, which can correspond to the respective output current $I_{OUT}$ of each of the third and fourth preamplifier systems 110 and 112. The overshoot current $I_{OSHT\_N}$ is added to the data current $I_{DAT}$ to provide the write current $I_{WRT}$ in a second direction opposite the first direction through the transducer 104. Similar to as described previously in the example of FIGS. 1 and 2, the rising-edge slew rate of the overshoot current $I_{OSHT\_N}$ can correspond to the magnitude of the activation current $I_{ACT}$ in each of the third and fourth preamplifier systems 110 and 112, and the approximate maximum magnitude of the overshoot current $I_{OSHT\_N}$ can correspond to the magnitude of the reference current $I_{REF}$, and thus the magnitude of the first clamping voltage $V_{CLMP+}$, in each of the third and fourth preamplifier systems 110 and 112. After a predetermined time for demagnetization of the transducer 104 from the logic-1 state, the activation signal ACT2 can be de-asserted to deactivate the first adjustable slew current source and the deactivation signal DCT2 can be asserted to activate the second adjustable slew current source. Thus, the overshoot current $I_{OSHT\_N}$ can be deactivated at a falling-edge slew rate that depends on the magnitude of the deactivation current $I_{DCT}$ in each of the third and fourth preamplifier systems 110 and 112. The deactivation signal DCT2 can be de-asserted after the overshoot current $I_{OSHT\_N}$ is deactivated, but the second adjustable slew current source can continue to provide a minimal amount of current to maintain deactivation of the overshoot current $I_{OSHT\_N}$. The data current $I_{DAT}$ can thus continue to be provided at the negative magnitude to continue to write logic-0 data to the magnetic medium.

Figure 4:
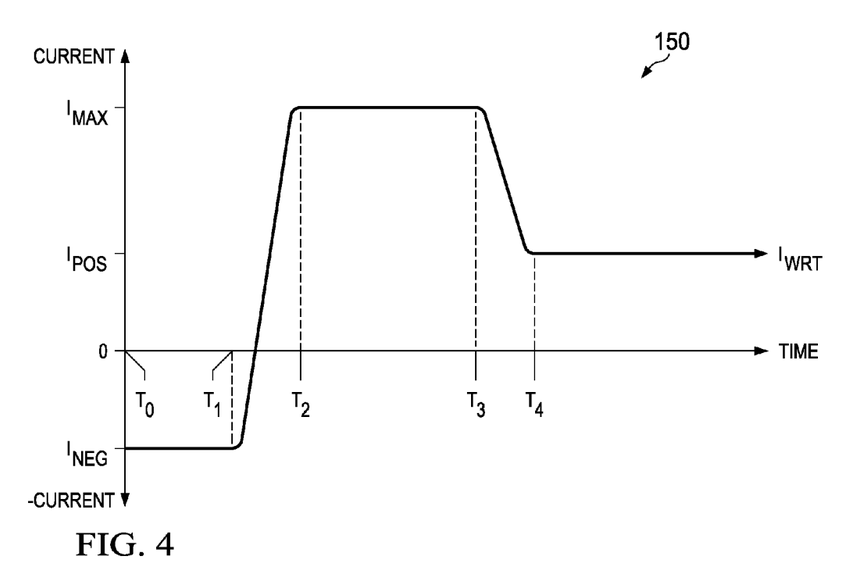
FIG. 4 illustrates an example of a timing diagram.

FIG. 4 illustrates an example of a timing diagram 150 demonstrating a plot of the write current $I_{WRT}$ as a function of time. The write current $I_{WRT}$ in the example of FIG. 4 can correspond to the write current $I_{WRT}$ in the example of FIG. 3. Therefore, reference is to be made to the example of FIG. 3 in the following description of the example of FIG. 4. As an example, the write current $I_{WRT}$ is demonstrated in the example of FIG. 4 as a sum of the data current $I_{DAT}$ generated by the balanced write system 102 and the overshoot current $I_{OSHT\_P}$ generated by the preamplifier systems 106 and 108. A positive magnitude of the write current $I_{WRT}$ corresponds to the write current $I_{WRT}$ being provided in the first direction through the transducer 104, while a negative magnitude of the write current $I_{WRT}$ corresponds to the write current $I_{WRT}$ being provided in the second direction through the transducer 104.

At a time $T_0$, the balanced write system 102 is writing logic-0 data to the magnetic medium via the transducer 104, subsequent to an overshoot via the third and fourth preamplifier systems 110 and 112. Therefore, the write current $I_{WRT}$ has a magnitude of $I_{NEG}$, which can be approximately equal to the negative magnitude of the data current $I_{DAT}$ plus a zero magnitude of overshoot current $I_{OSHT}$ (i.e., the overshoot currents $I_{OSHT\_P}$ and $I_{OSHT\_N}$). At a time $T_1$, the balanced write system 102 is to write logic-1 data to the magnetic medium via the transducer 104. Thus, the balanced write system 102 begins to provide the data current $I_{DAT}$ at the positive magnitude. In addition, the activation signal ACT1 is asserted in each of the first and second preamplifier systems 106 and 108 to provide the overshoot current $I_{OSHT\_P}$. Thus, the write current $I_{WRT}$ increases from the magnitude $I_{NEG}$ at the time $T_1$ to a magnitude of $I_{MAX}$ at a time $T_2$, which can be approximately equal to the positive magnitude of the data current $I_{DAT}$ plus the approximate maximum magnitude of overshoot current $I_{OSHT\_P}$. Thus, at the time $T_2$, the reference voltage $V_{REF}$ in each of the first and second preamplifier systems 106 and 108 is approximately equal to the first clamping voltage $V_{CLMP+}$. The rising-edge slew rate of the write current $I_{WRT}$ can be based on the rising-edge slew rate of the overshoot current $I_{OSHT\_P}$, and thus based on the magnitude of the activation current $I_{ACT}$ in each of the first and second preamplifier systems 106 and 108.

At a time $T_3$, the activation signal ACT can be de-asserted in each of the first and second preamplifier systems 106 and 108, and the deactivation signal DCT can be asserted. Therefore, the first adjustable slew current source 64 in each of the first and second preamplifier systems 106 and 108 is deactivated to cease the activation current $I_{ACT}$ being provided to the reference node 62, and the second adjustable slew current source 66 in each of the first and second preamplifier systems 106 and 108 is activated to provide the deactivation current $I_{DCT}$ from the reference node 62 in each of the first and second preamplifier systems 106 and 108. Thus overshoot current $I_{OSHT\_P}$ is deactivated, such that the write current $I_{WRT}$ decreases from the magnitude $I_{MAX}$ at the time $T_3$ to a magnitude $I_{POS}$ at a time $T_4$, around which time the reference voltage $V_{REF}$ in each of the first and second preamplifier systems 106 and 108 is approximately equal to the activation voltage (e.g., approximately $2*V_{BE}$). Therefore, at the time $T_4$ and thereafter, the write current $I_{WRT}$ has the magnitude of $I_{POS}$, which can be approximately equal to the positive magnitude of the data current $I_{DAT}$ plus a zero magnitude of overshoot current $I_{OSHT\_P}$. The falling-edge slew rate of the write current $I_{WRT}$ can be based on the falling-edge slew rate of the overshoot current $I_{OSHT\_P}$, and thus based on the magnitude of the deactivation current $I_{DCT}$ in each of the first and second preamplifier systems 106 and 108.

Accordingly, at the time $T_4$ and thereafter in the example of FIG. 4, the balanced write system 102 writes logic-1 data to the magnetic medium via the transducer 104. At some time after the time $T_4$, the balanced write system 102 can transition from writing logic-1 data to logic-0 data, such that the write current $I_{WRT}$ can follow an inverted plot relative to the timing diagram 150. Thus, the write current $I_{WRT}$ can decrease from $I_{POS}$ to a magnitude $-I_{MAX}$ based on the overshoot current $I_{OSHT\_N}$, which can be equal and opposite the magnitude $I_{MAX}$ in the example of FIG. 4, and can increase to $I_{NEG}$ after the overshoot current $I_{OSHT\_N}$ is deactivated.

Figure 5:
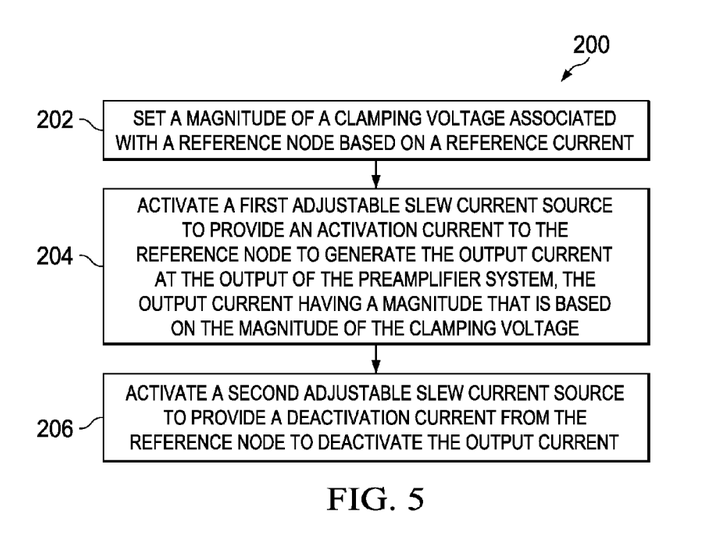
FIG. 5 illustrates an example of a method for generating an output current at an output of a preamplifier system.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method.

FIG. 5 illustrates an example of a method 200 for generating an output current at an output of a preamplifier system. At 202, a magnitude of a clamping voltage (e.g., the first clamping voltage $V_{CLMP+}$) associated with a reference node (e.g., the reference node 18) is set based on a reference current (e.g., the reference current $I_{REF}$). At 204, a first adjustable slew current source (e.g., the first adjustable slew current source 20) is activated to provide an activation current (e.g., the activation current $I_{ACT}$) to the reference node to generate the output current (e.g., the output current $I_{OUT}$) at the output (e.g., the output 72) of the preamplifier system (e.g., the preamplifier system 10), the output current having a magnitude that is based on the magnitude of the clamping voltage. At 206, a second adjustable slew current source (e.g., the second adjustable slew current source 22) is activated to provide a deactivation current (e.g., the deactivation current $I_{DCT}$) from the reference node to deactivate the output current.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A preamplifier system comprising:
    a reference stage configured to set a magnitude of a clamping voltage for a reference node based on a reference current generated in an adjustable reference current path; and
    an output stage comprising an adjustable slew current source that is configured to provide an activation current to the reference node in response to at least one activation signal, the output stage to generate an output current at an output of the output stage with a magnitude that is based on the clamping voltage,
    wherein the adjustable slew current source comprises:
        a first adjustable slew current source that is activated in response to a first activation signal to provide the activation current to the reference node to increase the output current and
        a second adjustable slew current source that is activated in response to a second activation signal to provide a deactivation current from the reference node to decrease the output current,
    wherein the reference stage is further configured to set a magnitude of a first clamping voltage and a second clamping voltage for the reference node based on the reference current, the reference stage comprises:
        a first clamping transistor coupled to the reference node, the first clamping transistor being activated to conduct the activation current based on a reference voltage at the reference node increasing to a magnitude that is approximately equal to the first clamping voltage in response to activation of the first adjustable slew current source; and
        a second clamping transistor coupled to the reference node, the second clamping transistor being activated to conduct the deactivation current based on the reference voltage decreasing to a magnitude that is approximately equal to the second clamping voltage in response to activation of the second adjustable slew current source.

2. The system of claim 1, wherein the adjustable slew current source is configured to provide the activation current to the reference node to provide the output current with a slew-rate that is based on a magnitude of the activation current.

3. The system of claim 2, wherein the adjustable slew current source is a first adjustable slew current source, wherein the output stage comprises a second adjustable slew current source that is configured to generate a deactivation current that is provided from the reference node to provide the output current with a deactivation slew-rate that is based on a magnitude of the deactivation current.

4. The system of claim 1, wherein the first adjustable slew current source is adjustable to affect a rising-edge slew rate of the output current based on a magnitude of the activation current, and the second adjustable slew current source is adjustable to affect a falling-edge slew rate of the output current based on a magnitude of the deactivation current.

5. The system of claim 1, wherein the first adjustable slew current source is activated in response to the first activation signal to provide the activation current to increase the reference voltage at the reference node, and the second adjustable slew current source is activated in response to the second activation signal to provide the deactivation current to decrease the reference voltage, wherein the output stage comprises:
    a plurality of bias transistors configured to set an activation voltage based on the reference current, the activation voltage having a magnitude that is less than the first clamping voltage; and
    an output transistor that is activated to generate the output current in response to the reference voltage exceeding the activation voltage.

6. The system of claim 1, wherein the second adjustable slew current source is configured to conduct a minimal current in a rest state of the of the preamplifier system that is sufficient to maintain activation of the second clamping transistor in the rest state such that and the output current is substantially zero in the rest state.

7. The system of claim 1, wherein the reference current is a DC current that flows through a first resistor, and wherein the output current flows through a second resistor having a resistance that is less than the first resistor by a proportional gain factor, such that the output current has a magnitude that is greater than the reference current by the proportional gain factor.

8. An H-bridge preamplifier system comprising a plurality of preamplifier systems, each according to claim 1, the H-bridge preamplifier system further comprising a transducer coupled to the output of each of the plurality of preamplifier systems and configured to generate a magnetic field in a first state in response to conducting the output current generated by a first set of the plurality of preamplifier systems in a first direction and to generate the magnetic field in a second state in response to conducting the output current generated by a second set of the plurality of preamplifier systems in a second direction.

9. A hard-disk drive (HDD) write system comprising the H-bridge preamplifier system of claim 8.

10. A method for generating an output current at an output of a preamplifier system, the method comprising:
setting a magnitude of a clamping voltage associated with a reference node based on a reference current;
activating a first adjustable slew current source to provide an activation current to the reference node to generate the output current at the output of the preamplifier system, the output current having a magnitude that is based on the magnitude of the clamping voltage; and
activating a second adjustable slew current source to provide a deactivation current from the reference node to deactivate the output current
wherein setting the magnitude of the clamping voltage further comprises setting a magnitude of a DC reference current to set the magnitude of a first clamping voltage and a second clamping voltage associated with the reference node, the first clamping voltage defining an approximate maximum magnitude of the output current and the output current being deactivated in response to a voltage at the reference node being approximately equal to the second clamping voltage,
wherein activating the first adjustable slew current source comprises:
activating the first adjustable slew current source to increase a reference voltage at the reference node in response to the activation current being provided to the reference node; and
activating a first clamping transistor coupled to the reference node in response to the reference voltage being approximately equal to the first clamping voltage to conduct the activation current from the reference node;
wherein activating the second adjustable slew current source comprises:
activating the second adjustable slew current source to decrease the reference voltage in response to the deactivation current being provided from the reference node; and
activating a second clamping transistor coupled to the reference node in response to the reference voltage being approximately equal to the second clamping voltage to conduct the deactivation current to the reference node.

11. The method of claim 10, further comprising:
controlling a magnitude of the activation current to set a rising-edge slew rate of the output current; and
controlling a magnitude of the deactivation current to set a falling-edge slew rate of the output current.

12. The method of claim 10,
wherein activating the first adjustable slew current source comprises activating the first adjustable slew current source to increase a reference voltage at the reference node, and
wherein activating the second adjustable slew current source comprises activating the second adjustable slew current source to decrease the reference voltage, the reference voltage controlling an output transistor through which the output current flows.

13. The method of claim 10, further comprising maintaining a minimal current flow associated with the second adjustable slew current source from the reference node to maintain deactivation of the output current during a rest state of the preamplifier system.

14. A preamplifier system comprising:
a reference stage comprising an adjustable reference current path configured to conduct a reference current; and
an output stage comprising a first adjustable slew current source and a second adjustable slew current source, the first adjustable slew current source being activated to provide an activation current to generate an output current at an output of the output stage, the second adjustable slew current source being activated to provide a deactivation current to deactivate the output current, the output current having a magnitude that is based on the reference current and having a rising-edge slew rate and a falling-edge slew rate that is based on the activation current and the deactivation current, respectively,
wherein the adjustable reference current path is configured to generate the reference current to set a magnitude of a first clamping voltage and a second clamping voltage for a reference node that interconnects the reference stage and the output stage, the first clamping voltage defining an approximate maximum magnitude of the output current and the second clamping voltage defining deactivation of the output current,
wherein the reference stage comprises:
a first clamping transistor coupled to the reference node and being configured to activate to conduct the activation current in response to a reference voltage at the reference node increasing to a magnitude that is approximately equal to the first clamping voltage in response to activation of the first adjustable slew current source; and
a second clamping transistor coupled to the reference node and being configured to activate to conduct the deactivation current in response to the reference voltage decreasing to a magnitude that is approximately equal to the second clamping voltage in response to activation of the second adjustable slew current source.

* * * * *